(12) United States Patent
Ishizaki et al.

(10) Patent No.: US 12,543,307 B2
(45) Date of Patent: Feb. 3, 2026

(54) MICROELECTRONIC DEVICES, AND RELATED MEMORY DEVICES, ELECTRONIC SYSTEMS, AND METHODS

(71) Applicant: Micron Technology, Inc., Boise, ID (US)

(72) Inventors: Yuri Ishizaki, Hiroshima (JP); Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 542 days.

(21) Appl. No.: 17/930,232

(22) Filed: Sep. 7, 2022

(65) Prior Publication Data

US 2024/0081048 A1   Mar. 7, 2024

(51) Int. Cl.
    H10B 12/00   (2023.01)
(52) U.S. Cl.
    CPC ............ *H10B 12/50* (2023.02); *H10B 12/09* (2023.02); *H10B 12/315* (2023.02); *H10B 12/34* (2023.02)
(58) Field of Classification Search
    CPC ................................. H10D 84/85; H10B 12/50
    See application file for complete search history.

(56) References Cited

U.S. PATENT DOCUMENTS

| | | | | |
|---|---|---|---|---|
| 2010/0032732 A1* | 2/2010 | Booth, Jr. | ............... | H10B 20/25 257/E21.409 |
| 2011/0031582 A1* | 2/2011 | Booth, Jr. | ........... | H01L 23/5252 257/734 |
| 2016/0141292 A1* | 5/2016 | Hoffmann | ............ | H10D 84/017 257/369 |
| 2018/0151739 A1* | 5/2018 | Liang | ................. | H10D 30/6212 |
| 2018/0174926 A1* | 6/2018 | Moriwaki | ............ | H10D 64/683 |
| 2019/0013323 A1* | 1/2019 | Bhattacharyya | ..... | H10D 30/694 |
| 2019/0280108 A1* | 9/2019 | Toh | ....................... | H10D 86/215 |
| 2020/0091236 A1* | 3/2020 | Hokazono | .............. | H10N 70/20 |
| 2020/0295161 A1* | 9/2020 | Toh | ....................... | H10D 30/024 |
| 2021/0328017 A1* | 10/2021 | Reznicek | ............. | H10D 62/834 |
| 2022/0199774 A1* | 6/2022 | Wei | ..................... | H10D 30/6211 |
| 2022/0199779 A1* | 6/2022 | Kawana | ............... | H10D 62/852 |
| 2022/0223695 A1* | 7/2022 | More | ................. | H10D 84/0177 |
| 2022/0231153 A1* | 7/2022 | Lu | ...................... | H01L 21/02178 |
| 2022/0285496 A1* | 9/2022 | Chen | .................... | H10D 30/751 |
| 2022/0293582 A1* | 9/2022 | Moriwaki | ............. | H10D 84/85 |

* cited by examiner

*Primary Examiner* — Edward Chin
(74) *Attorney, Agent, or Firm* — TraskBritt (57) ABSTRACT

A microelectronic device, comprises a base structure comprising: active regions individually comprising semiconductor material; and isolation regions horizontally alternating with the active regions and individually comprising insulative material; epitaxial semiconductor material on the semiconductor material of one of the active regions, the epitaxial semiconductor material substantially confined within a horizontal area of the one of the active regions and offset from horizontal boundaries of two of the isolation regions horizontally neighboring the one of the active regions; gate dielectric material on the epitaxial semiconductor material, portions of the semiconductor material of the one of the active regions not covered by the epitaxial semiconductor material, and portions of the two of the isolation regions; and a gate electrode stack on the gate dielectric material.

21 Claims, 6 Drawing Sheets

MICROELECTRONIC DEVICES, AND RELATED MEMORY DEVICES, ELECTRONIC SYSTEMS, AND METHODS

TECHNICAL FIELD

The disclosure, in various embodiments, relates generally to the field of integrated circuit device design and fabrication. More specifically, the disclosure relates to microelectronic devices including complementary metal-oxide-semiconductor (CMOS) devices, and to related memory devices, electronic systems, and methods.

BACKGROUND

Integrated circuitry may include complementary metal oxide semiconductor (CMOS) devices including CMOS circuitry including a p-type metal oxide semiconductor (PMOS) transistor including a p-type channel region, and an n-type metal oxide semiconductor (NMOS) transistor including an n-type channel region. A continued goal of integrated circuitry design is to develop CMOS devices having PMOS and NMOS transistors configured to achieve desired operational parameters, and to develop methods for fabricating such CMOS devices. Unfortunately, miniaturization creates fabricating and performances challenges that affect the performance of the CMOS devices.

DETAILED DESCRIPTION

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, an integrated-circuit device, a disaggregated-die integrated circuit device). The structures described below do not form a complete microelectronic device. However, those process acts and structures are useful to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis. Further as used herein, a gate width direction may be presented as a "W" axis in a CMOS device, where the Y-axis is supplanted with the W-axis to indicate the direction of a gate width.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, "semiconductor material" and "semiconductive material" each refer to a material having an electrical conductivity between those of electrically insulating materials and electrically conductive materials. For example, a semiconductor material may have an electrical conductivity of between about 10-8 Siemens per centimeter (S/cm) and about 104 S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_x Ga_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "doped semiconductor material" and "doped semiconductive material" each refer to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "semiconductor substrate" means a base semiconductive material, or construction including semiconductive material, upon which additional features (e.g., materials, structures, devices) of a relatively larger structure are formed. A semiconductor substrate may, for example, includes bulk semiconductive material, such as a semiconductive wafer (either alone or in assemblies comprising other materials), and/or semiconductive material overlying another structure. The term "substrate" refers to a base material or construction, including, but not limited to, the semiconductor substrate described above.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1:
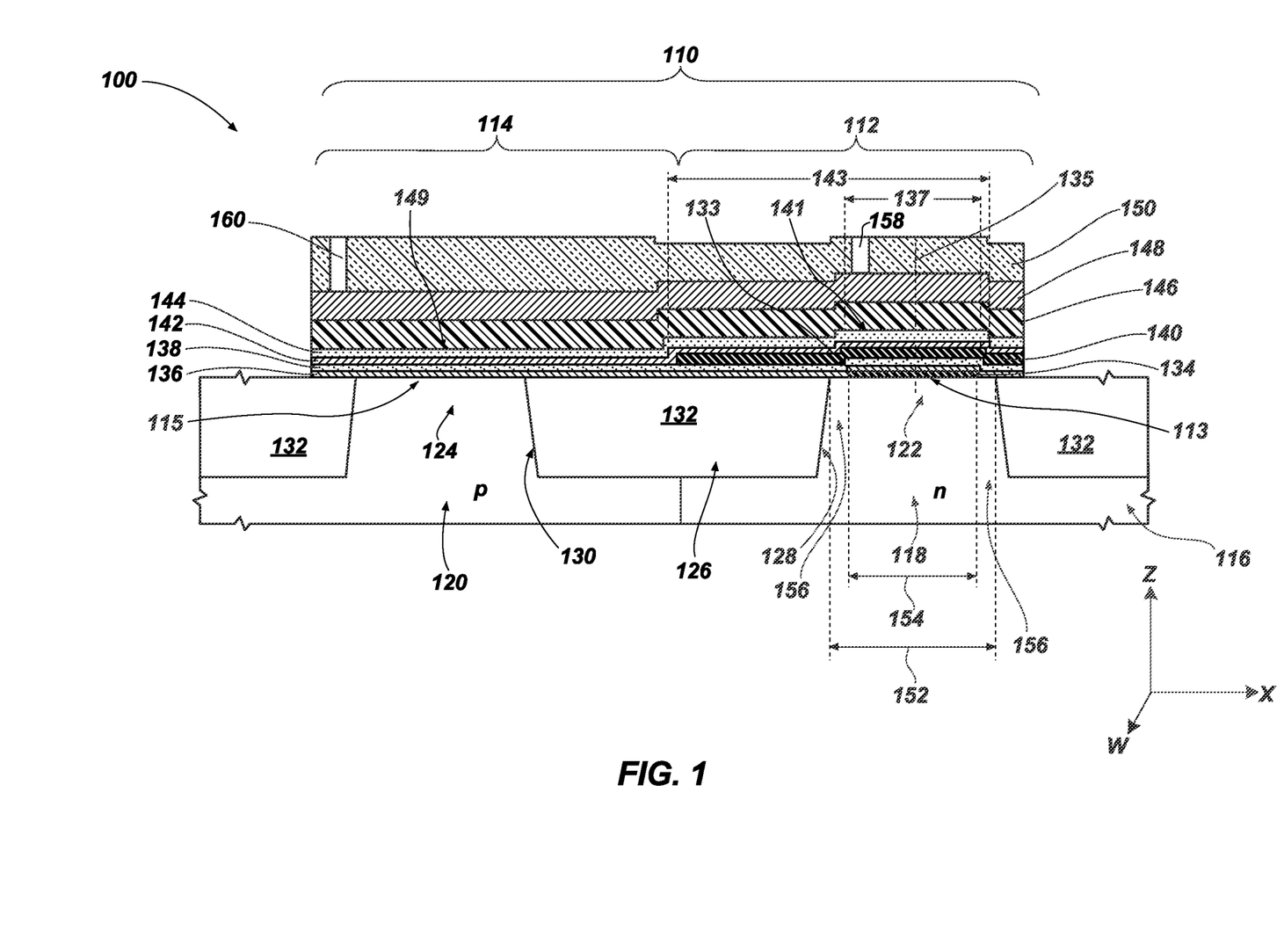
FIG. 1 is a simplified longitudinal cross-section elevation view of a microelectronic device including a CMOS device structure.

FIG. 1 is a simplified longitudinal cross-section elevation view of a microelectronic device structure 100 including a CMOS device structure 110. The CMOS device structure 110 includes a PMOS transistor structure 112 and an NMOS transistor structure 114 at least partially overlying a semiconductor substrate 116. The semiconductor substrate 116 includes an n-type functioning region 118 horizontally adjacent a p-type functioning region 120. The semiconductor substrate 116 may be formed of and include semiconductor material, such as doped monocrystalline silicon. As described in further detail below, portions of the PMOS transistor structure 112 and the semiconductor substrate 116 may form and define a PMOS transistor 113 of the CMOS device structure 110; and portions of the NMOS transistor structure 114 and additional portions of the semiconductor substrate 116 may form and define a NMOS transistor 115 of the CMOS device structure 110.

The PMOS transistor structure 112 includes a p-channel region 122 within a horizontal area of the n-type functioning region 118 of semiconductor substrate 116. The NMOS transistor structure 114 includes an n-channel region 124 within a horizontal area of the P-type functioning region 120 of semiconductor substrate 116.

An isolation region 126 is horizontally interposed between the PMOS transistor structure 112 and the NMOS transistor structure 114. The PMOS transistor 113 may be positioned at a first side 128 of the isolation region 126, and the NMOS transistor 115 may be positioned at a second side 130 of the isolation region 126, where the second side 130 of the isolation region 126 is opposite the first side 128 of the isolation region 126. The isolation region 126 may have a shallow-trench isolation (STI) configuration. The isolation region 126 may be a trench within the semiconductor substrate 116 filled with insulative material 132. In some embodiments, the insulative material 132 is dielectric oxide material, such as silicon dioxide.

The PMOS transistor structure 112 may include an epitaxial channel material 134 vertically overlying and partial horizontally covering the p-channel region 122. The epitaxial channel material 134 may be formed of and include at least one material that imparts the PMOS transistor 113 with desired threshold voltage (VT) characteristics and that facilitates a desired width of the p-channel region 122, as discussed below. The epitaxial channel material 134 may be employed, at least in part, to strain a crystal lattice under a gate electrode stack of the PMOS transistor 113 so as to increase electron mobility and facilitate higher drive current. In some embodiments, the epitaxial channel material 134 is formed of and includes a silicon germanium (SiGe) material. The epitaxial channel material 134 may have a thickness (Z-direction) within a range of from about 1.5 nm to about 20 nm.

The CMOS device structure 110 further includes additional materials forming portions of the PMOS transistor structure 112 and the NMOS transistor structure 114, such as gate dielectric materials and gate electrode materials. As shown in FIG. 1, in some embodiments, the gate dielectric materials include a first gate dielectric material 136 extending on or over the epitaxial channel material 134, and portions of the semiconductor substrate 116 and the insulative material 132 of the isolation region 126; and a second gate dielectric material 138 extending on or over the first gate dielectric material 136. In an embodiment, the first gate dielectric material 136 is formed of and includes a dielectric oxide material, such as silicon dioxide ($SiO_2$); and the second gate dielectric material 138 is formed of and includes a high-k dielectric oxide material (where "high-k" means a higher dielectric constant than silicon dioxide), such as hafnium oxide ($HfO_x$).

With further reference to the PMOS transistor structure 112 (and, hence, the PMOS transistor 113) may further include a gate electrode stack 141 overlying the gate dielectric materials (e.g., overlying the second gate dielectric material 138). The gate electrode stack 141 may include a first gate electrode material 140 over the second gate dielectric material 138, a second gate electrode material 142 over the first gate electrode material 140, and a third gate electrode material 144 over the second gate electrode material 142. In addition, the NMOS transistor structure 114 (and, hence, the NMOS transistor 115) may include an additional gate electrode stack 149 free of the first gate electrode material 140 but including the other gate electrode materials (e.g., the second gate electrode material 142, the third gate electrode material 144) of the gate electrode stack 141. For the additional gate electrode stack 149, the second gate electrode material 142 overlies the second gate dielectric material 138, the third gate electrode material 144 overlies the second gate electrode material 142.

For the PMOS transistor structure 112, the first gate electrode material 140 may extend on or over the second gate dielectric material 138 within a horizontal area of the PMOS transistor structure 112. The first gate electrode material 140 may horizontally overlap the p-channel region 122. The first gate electrode material 140 may not horizontally extend into a horizontal area of the NMOS transistor structure 114. The first gate electrode material 140 may include a first conductive material, and may impart the PMOS transistor 113 with different VT characteristics than the NMOS transistor 115. In some embodiments, the first gate electrode material 140 is formed of and includes conductive nitride material, such as titanium aluminum nitride (TiAlN). Dimensional relationships of horizontal lengths of the first gate electrode material 140 with respect to the epitaxial channel material 134 and to channel-end regions 156 of the CMOS device structure 110 are further disclosed below.

The second gate electrode material 142 extends on or over the first gate electrode material 140, and portions of the second gate dielectric material 138 not covered by the first gate electrode material 140. The second gate electrode material 142 may extend across horizontal areas of the PMOS transistor structure 112 and the NMOS transistor structure 114. The second gate electrode material 142 may horizontally overlap the p-channel region 122 and the n-channel region 124 of the CMOS device structure 110. The second gate electrode material 142 may include a second conductive material different than that of the first gate electrode material 140. In some embodiments, the second gate electrode material 142 is formed of and includes elemental metal, such as lanthanum (La). In an embodiment, the second gate electrode material 142 has a thickness within a range of from about 5 nm to about 10 nm, such as from about 6 nm to about 8 nm.

The third gate electrode material 144 extends on or over the second gate electrode material 142. The third gate electrode material 144 may extend across horizontal areas of the PMOS transistor structure 112 and the NMOS transistor structure 114. The third gate electrode material 144 may horizontally overlap the p-channel region 122 and the n-channel region 124 of the CMOS device structure 110. The third gate electrode material 144 may include a third conductive material different than that of each of the first gate electrode material 140 and the second gate electrode material 142. In some embodiments, the third gate electrode material 144 is formed of and includes conductive metal nitride material, such as titanium nitride ($TiN_x$).

Figure 2:
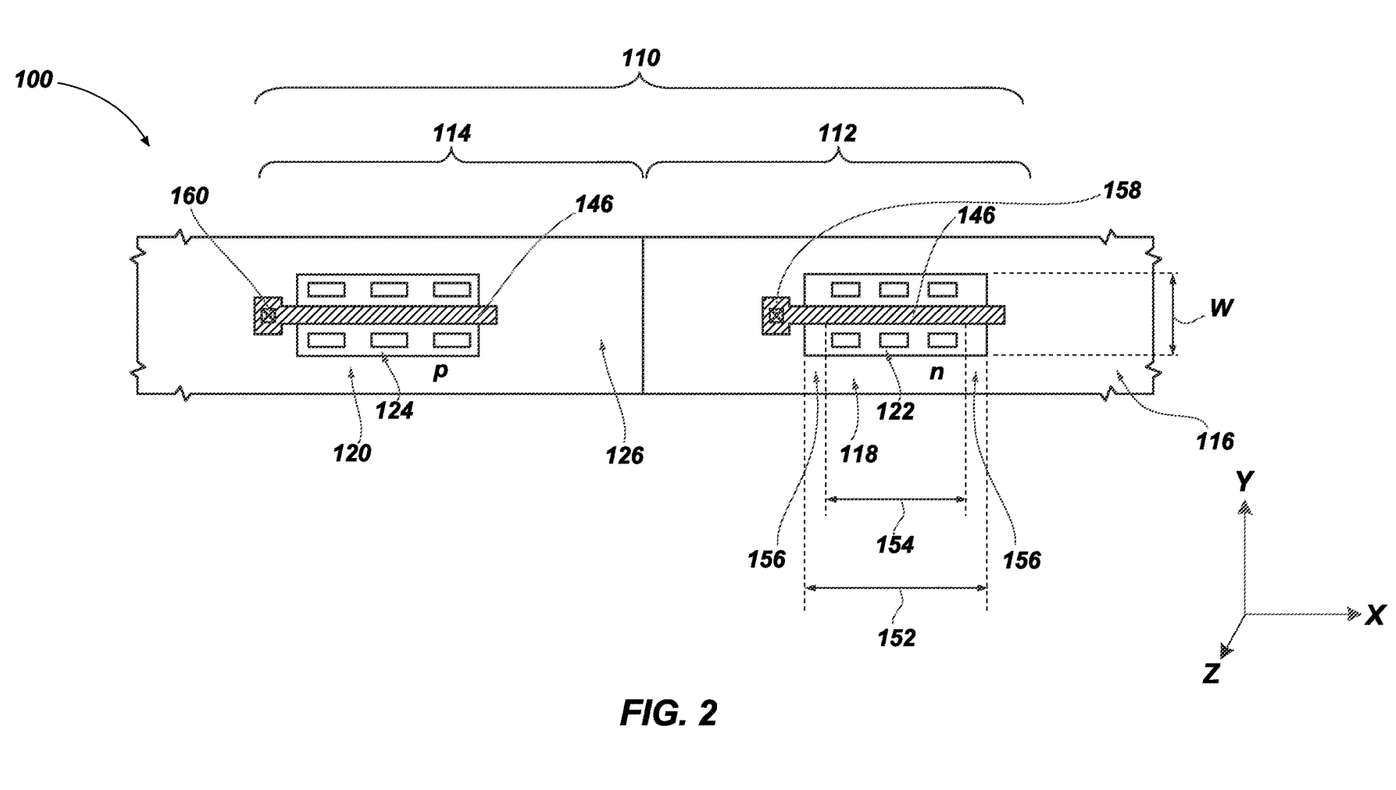
FIG. 2 is a simplified, partial top view of the microelectronic device depicted in FIG. 1.

Referring collectively to FIGS. 1 and 2, the CMOS device structure 110 further includes peripheral interconnect structures (146, 148 and 150, further described herein) vertically overlying and operatively associated with the gate electrode stack 141 and the additional gate electrode stack 149. Some of the peripheral interconnect structures may horizontally overlap each of the gate electrode stack 141 (and underlying p-channel regions 122); and other of the peripheral interconnect structures may horizontally overlap the additional gate electrode stack 149 (and underlying n-channel regions 124). The peripheral interconnect structures may be less than completely horizontally cover the gate electrode stack 141 and the additional gate electrode stack 149, and may couple the gate electrode stack 141 (and, hence, the PMOS transistor 113) and the additional gate electrode stack 149 (and, hence, the NMOS transistor 115) to additional features of an integrated-circuit device including the CMOS device structure 110. The peripheral interconnect structures may individually include a first conductive interconnect material 146 on or over the third gate electrode material 144, and a second conductive interconnect material 148 on or over the first conductive interconnect material 146.

The first conductive interconnect material 146 of the peripheral interconnect 145 may be formed of and include conductive material. In some embodiments, the first conductive interconnect material 146 is formed of and includes conductively doped polycrystalline silicon. In an embodiment, the first conductive interconnect material 146 has a thickness (Z-direction) within a range of from abo 50 nm.

The second conductive interconnect material 148 of the peripheral interconnect structures may be formed of and include additional conductive material different than that of first conductive interconnect material 146. In some embodiments, the second conductive interconnect material 148 is formed of and includes elemental metal, such as tungsten (W).

Referring to FIG. 1, dielectric cap material 150 may extend on or over the peripheral interconnect structures, the gate electrode stack 141, and the additional gate electrode stack 149. The dielectric cap material 150 extends across horizontal areas of the PMOS transistor structure 112 and the NMOS transistor structure 114. The dielectric cap material 150 may horizontally overlap the p-channel region 122 and the n-channel region 124 of the CMOS device structure 110. The dielectric cap material 150 may include dielectric material. In some embodiments, the dielectric cap material 150 is formed of and includes dielectric nitride material, such as $Si_3N_4$. Consequently, the peripheral interconnect structures may include the first conductive interconnect material 146, and the second conductive interconnect material 148 among others. For example although the dielectric cap material 150 is not conductive, it may be referred to as a portion of the peripheral interconnect structures.

Still referring to FIG. 1, the p-channel region 122 has a first horizontal dimension 152 (e.g., channel length) in the X-direction and the epitaxial channel material 134 thereover has a second horizontal dimension 154 (e.g., length) in the X-direction that is less than the first horizontal dimension 152. Consequently, channel-end regions 156 are created by the horizontal positioning and horizontal dimensions of the epitaxial channel material 134. By creating the channel-end regions 156 where no epitaxial channel material 134 is present, higher VT is obtained within the channel-end regions 156 as compared to within a horizontal area of the epitaxial channel material 134. In an embodiment, the channel-end regions 156 have a length in the X-direction within a range from about 10 nanometers (nm) to about 20 nm.

Additional features of CMOS device structure 110 include contact structures in electrical communication with the gate electrode stack 141 and the additional gate electrode stack 149. For example, first contact structures 158 may vertically extend through the dielectric cap material 150 and contact the second conductive interconnect material 148 of some of the peripheral interconnect structures horizontally overlapping and operatively associated with the gate electrode stack 141; and second contact structure 160 may vertically extend through the dielectric cap material 150 and contact the second conductive interconnect material 148 of some other of the peripheral interconnect structures horizontally overlapping and operatively associated with the additional gate electrode stack 149. The first contact structure 158 may electrically connect the gate electrode stack 141 (and, hence, the PMOS transistor 113) to additional features of an integrated-circuit device including the CMOS device structure 110; and the second contact structure 160 may electrically connect the additional gate electrode stack 149 (and, hence, the NMOS transistor 115) to further features of the integrated-circuit device including the CMOS device structure 110. The first contact structure 158 and the second contact structure 160 may be formed of and include conductive material (e.g., doped polycrystalline silicon).

Still referring to FIG. 1, the first gate dielectric material 136 forms an independent topology source structure 133 over the epitaxial channel material 134. By "independent topology source structure 133" it is meant that a Z-direction topology structure extends across the areas of the PMOS transistor structure 112 and the NMOS transistor structure 114, with a new Z-direction topology for the entire structure of the first gate dielectric material 136. The independent topology source structure 133 is also illustrated during assembly in FIG. 3A. The first gate dielectric material 136 as it is conformally over the epitaxial channel material 134 and over the semiconductor material of the p-channel region 122 of the n-type functioning region 118. The independent topology source structure 133 is depicted as exhibiting different heights in the Z-direction within a horizontal area of the p-channel region 122. The independent topology source structure 133 may have a third horizontal dimension 137 in the X-direction that is larger than the second horizontal dimension 154 of the epitaxial channel material 134 and smaller than the first horizontal dimension 152 of the p-channel region 122. With several other materials including the dielectric cap material 150, the independent topology source structure 133 is substantially horizontally centered about the epitaxial channel material 134. The independent topology source structure 133 may be substantially bilaterally symmetrical about a symmetry line 135 that bisects the epitaxial channel material 134 and the p-channel region 122 of the PMOS transistor structure 112.

In addition, the second gate electrode material 142 over the first gate electrode material 140 forms a dependent topology source structure 199 that expands both laterally (X-direction) and vertically (Z-direction). By "dependent topology source structure 199" it is meant that a Z-direction topology adds at least one unique new feature that is cumulative to an independent topology source structure. In the illustrated example, the dependent topology source structure 199 repeats the independent topology source structure 133, and the dependent topology source structure 199 adds a topology feature(s) not sourced from the independent topology source structure 133. For example with formation of the first gate electrode material 140 principally within the region of the PMOS transistor structure 112, the dependent topology source structure 199 originates from the second gate electrode material 142 as it is conformally over the first gate electrode material 140 and over the second gate dielectric material 138. The dependent topology source structure 199 is depicted in an X-direction length of fourth horizontal dimension 143 and at a Z-height that is characteristic of the thickness (Z-direction) of the first gate electrode material 140 and the second gate electrode material 142. The dependent topology source structure 199 has an asymmetrical form factor compared to the independent topology source structure 133, were the dependent topology source structure 199 is over the p-channel region 122 of the n-type functioning region 118, of the PMOS transistor structure 112, where the characteristic asymmetrical form factor is substantially skewed away from the symmetry line 135 and toward the n-channel region 124 of the p-type functioning region 120, of the NMOS transistor structure 114. Further description of the dependent topology source structure 199 is set forth in FIG. 3B.

Figure 4:
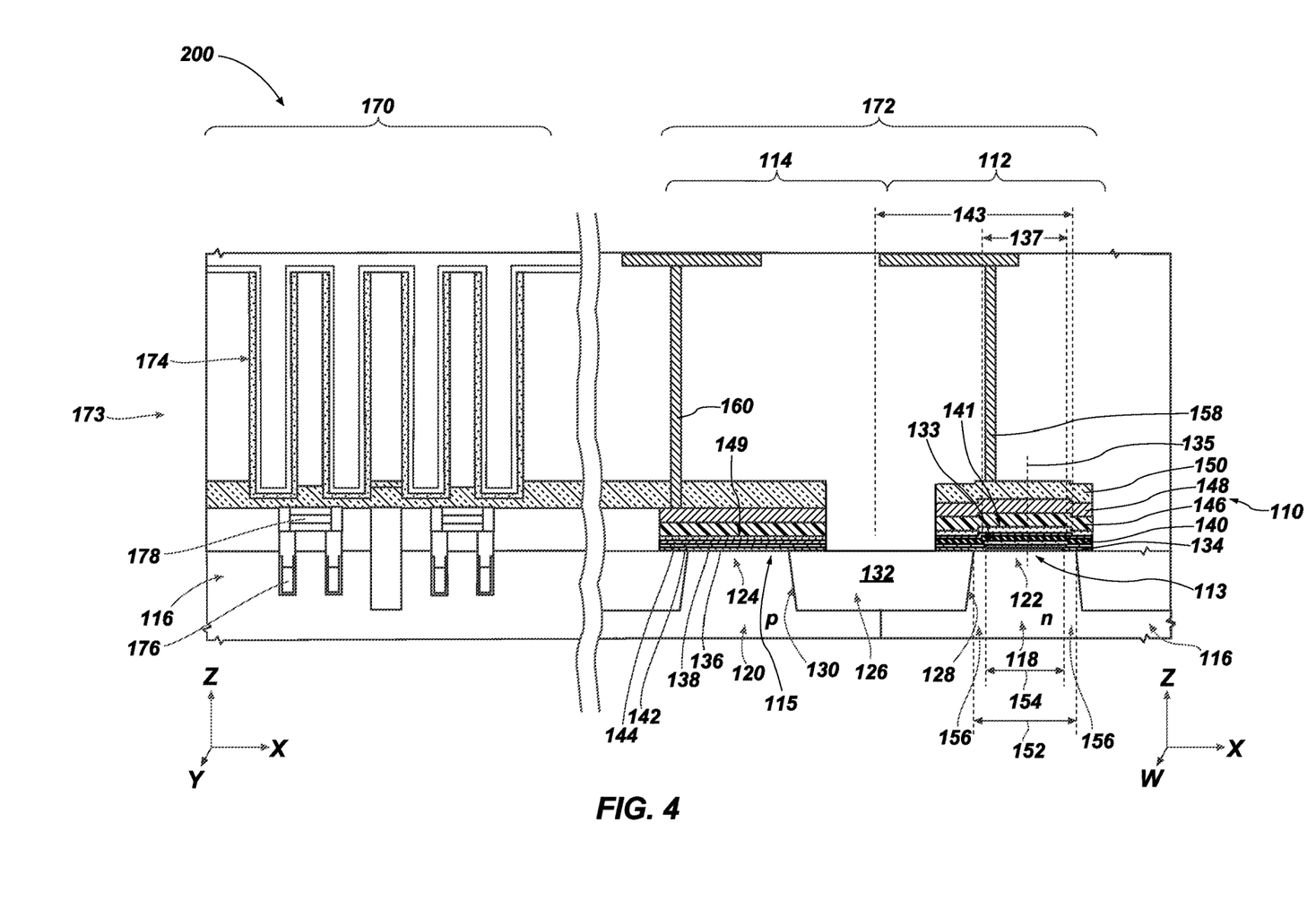
FIG. 4 illustrates a simplified partial elevational cross-section view of a portion of a microelectronic device such as a memory device, according to embodiments of the disclosure.

FIG. 2 is a simplified, partial top view of the microelectronic device structure 100 depicted in FIG. 1, after a gate process to separate the NMOS transistor structure 114 from the PMOS transistor 113 structure (see also FIG. 4). The p-channel region 122 and the n-channel region 124 are also characterized by a gate width, W, which is depicted generically in the Y-direction with a W that is substantially orthogonal to the X-direction. Characteristic behavior of the PMOS transistor structure 112 is affected in part by the first horizontal dimension 152, the gate width, W, the second horizontal dimension 154 of the epitaxial channel material 134 (and the thickness of the epitaxial channel material 134) and the channel-end regions 156. Consequently, the p-channel region 122 has useful properties (e.g., Vt properties, current leakage properties) affected, at least in part, by such dimensions as the gate width, W, in connection with the first horizontal dimension 152 of the p-channel region 122, the second horizontal dimension 154 of the epitaxial channel material 134 (FIG. 1), and the horizontal dimensions of the channel-end regions 156.

Figure 3A:
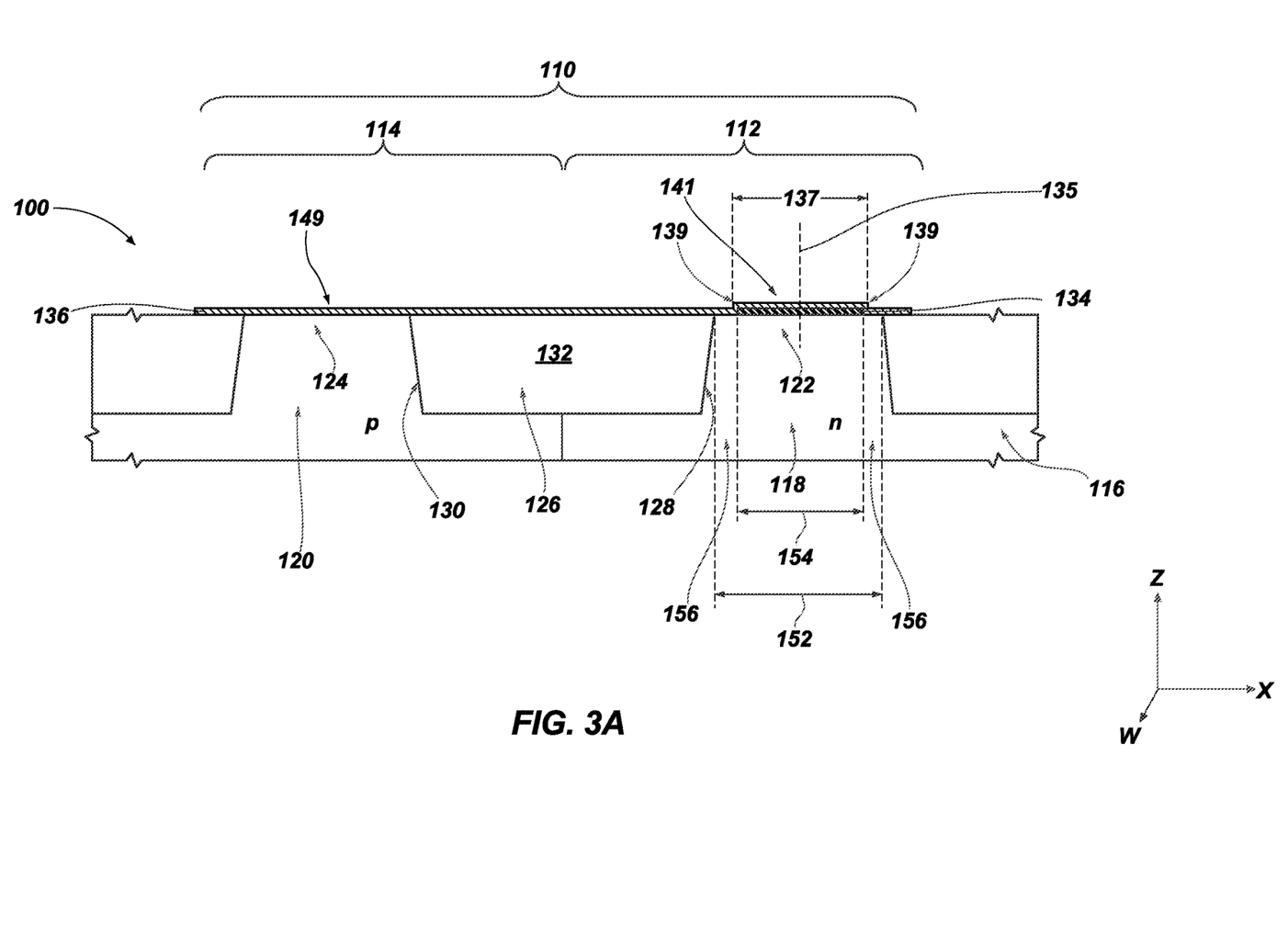
FIGS. 3A and 3B are simplified cross-section elevation views of the microelectronic device structure depicted in FIGS. 1 and 2 during fabrication.
Figure 3B:
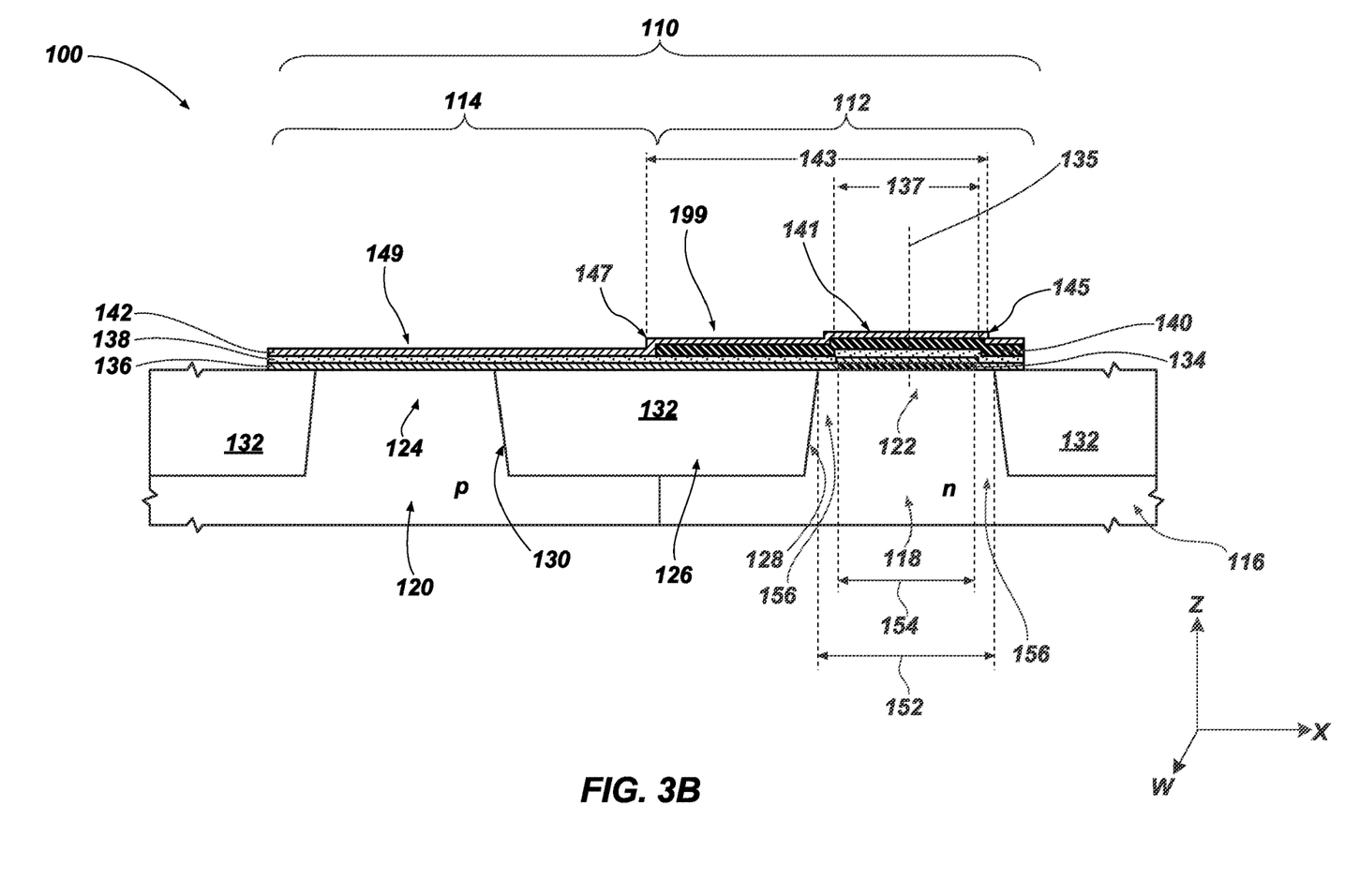

FIGS. 3A and 3B are simplified cross section elevation views of the microelectronic device structure 100 depicted in FIGS. 1 and 2 at different processing stages of a process of forming the microelectronic device structure 100 shown in FIGS. 1 and 2, according to several embodiments. FIG. 3A illustrates processing including formation of the epitaxial channel material 134. The epitaxial channel material 134 is first formed over the upper surfaces of the semiconductor substrate 116 and the insulative material 132, followed by patterning and material removal to leave the epitaxial channel material 134 as illustrated. In an embodiment, the epitaxial channel material 134 is substantially bilaterally symmetrical about the symmetry line 135, and the epitaxial channel material 134 is vertically above and within a horizontal area of the p-channel region 122 interposed between the neighboring isolation regions 126.

A channel material may be epitaxially grown on the semiconductor substrate 116, and then portions thereof may be removed to form the epitaxial channel material 134 within the p-channel region 122, as well as the channel-end regions 156. By formation of the channel-end regions 156, a threshold voltage (Vt) is increased and a useful Vt is combined with lowered current leakage at the edges of the PMOS transistor 113. Thereafter, the first gate dielectric material 136 may be conformally formed over the epitaxial channel material 134 and portions of the semiconductor substrate 116 and the insulative material 132 not covered by the epitaxial channel material 134. The independent topology source structure 133 is characterized by the third horizontal dimension 137 (X-direction), the height (Z-direction) of the combination of the epitaxial channel material 134 and the first gate dielectric material 136 above the upper surfaces of the semiconductor substrate 116 and the insulative material 132, and by step features 139 effectuated by the foregoing.

FIG. 3B illustrates the microelectronic device structure 100 at a processing stage following that described above with reference to FIG. 3A. As shown in FIG. 3B, the second gate dielectric material 138 is formed on or over the first gate dielectric material 136, followed by formation of the first gate electrode material 140. Conductive material of the first gate electrode material 140 is formed over the upper surfaces of the second gate dielectric material 138, followed by removal of portions of the conductive material to form the first gate electrode material 140 as illustrated. Thereafter, the second gate electrode material 142 is formed on or over the first gate electrode material 140. The dependent topology source structure 199 repeats the independent topology source structure 133, and adds topology not sourced from the independent topology source structure 133. As illustrated in FIG. 3B, the dependent topology source structure 199 is characterized by a fourth horizontal dimension 143 in the X-direction, a height in Z-direction effectuated by combination of the first gate electrode material 140 and the second gate electrode material 142, and by a first step feature 145 and a second step feature 147 resulting from the foregoing. The dependent topology source structure 199 is further characterized by the second step feature 147 being lower (Z-direction) than the first step feature 145. The dependent topology source structure 199 is further characterized by an asymmetrical deployment about the symmetry line 135, where a horizontal center of the dependent topology source structure 199 is horizontally offset (e.g., in the X-direction) from the symmetry line 135, toward the NMOS transistor structure 114. In some embodiments, the fourth horizontal dimension 143 is curtailed after a gate process to separate the NMOS transistor structure 114 from the PMOS transistor 113 structure, as further described and illustrated in FIG. 4. In some embodiments, the fourth horizontal dimension 143 may be retained where the gate process may asymmetrically remove material above the insulative material 132 that forms the isolation region 126 between the gate electrode stack 141 and the additional gate electrode stack 149.

Microelectronic device structures (e.g., the microelectronic device structure 100 in FIGS. 1 and 2) of the disclosure may be included in microelectronic devices of the disclosure. For example, FIG. 4 illustrates a simplified partial elevational cross-sectional view of a portion of a microelectronic device 200 (e.g., a memory device, such as a DRAM device). The microelectronic device 200 may include a DRAM device in a memory array region 170. Further, the microelectronic device 200 may include a peripheral circuit region 172 (e.g., a logic region) located at or proximate a periphery (e.g., outer boundary) of the memory array region 170. The peripheral circuit region 172 may be electrically coupled to the array region by the peripheral interconnect structures including the first conductive interconnect material 146, the second conductive interconnect material 148, the first contact structure 158, and the second contact structure 160. The memory array region 170 may include a memory device structure 173 including memory cells 174 (e.g., DRAM cells) arranged in an array within an X-Y plane. The peripheral circuit region 172 may include the CMOS device structure 110 previously described with reference to FIGS. 1 and 2, as well as circuitry for controlling operations of the memory cells 174 within the memory array region 170.

The memory array region 170 includes the memory device structure 173 that includes storage devices 174, such as capacitor cells, access lines 176 (word lines, select lines) to access the storage devices 174, and data lines 178 (bit lines) for signal and data communication to other parts of the microelectronic device 200. In an embodiment, the CMOS device structure 110 may be used for other functions that are not associated with a memory device structure 173.

Figure 5:
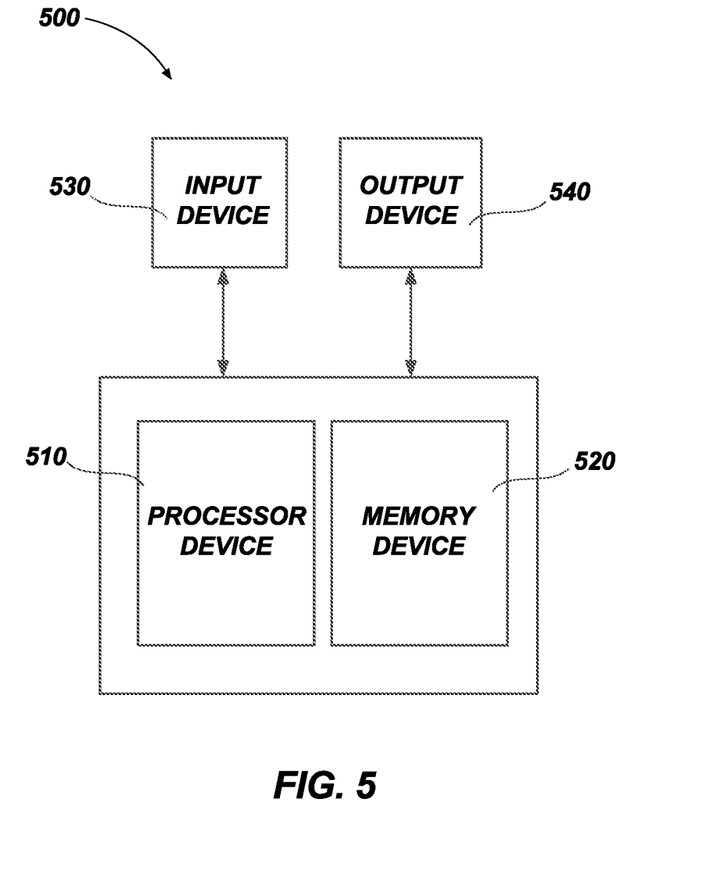
FIG. 5 is a simplified block diagram of an electronic system, according to embodiments of the disclosure.

Microelectronic devices (e.g., the microelectronic device 200 (FIG. 4)) and microelectronic device structures (e.g., the microelectronic device structure 100 (FIGS. 1 and 2)) of the disclosure may be included in embodiments of electronic systems of the disclosure. For example, FIG. 5 is a block diagram of an electronic system 500, according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, where embodiments of the microelectronic device structure 100 (FIG. 1) may be employed. The electronic system 500 includes at least one memory device 520. The memory device 520 may include, for example, one or more of a microelectronic device (e.g., the microelectronic device 200 (FIG. 4)) and a microelectronic device structure (e.g., the microelectronic device structure 100 (FIGS. 1 and 2)) of the disclosure. The electronic system 500 may further include at least one electronic signal processor device 510 (often referred to as a "microprocessor") that is part of an integrated circuit. The electronic signal processor device 510 may include, for example, one or more of microelectronic devices (e.g., the microelectronic device structure 100 (FIG. 2), the microelectronic device 200 (FIG. 4)) of the disclosure. While the memory device 520 and the electronic signal processor device 510 are depicted as two (2) separate devices in FIG. 5, in additional embodiments, a single (e.g., only one) memory/processor device having the functionalities of the memory device 520 and the electronic signal processor device 510 is included in the electronic system 500. In such embodiments, the memory/processor device may include, for example, one or more of a microelectronic device (e.g., the microelectronic device 200 (FIG. 4)) and a microelectronic device structure (e.g., the microelectronic device structure 100 (FIGS. 1 and 2)) of the disclosure. The processor device 510 and the memory device 520 may be part of a central processing unit where the memory device 520 includes a CMOS device structure 110 in on-die DRAM cache memory. The processor device 510 and the memory device 520 may be part of a disaggregated-die assembly 550 that may also be referred to as a disaggregated-die integrated circuit, including at least one of the processor device 510 and the memory device 520 includes more than one of such device in a more-than-two device disaggregated-die integrated circuit assembly. Further, the disaggregated-die assembly 550 may be assembled with a bridge material such as in an embedded multi-interconnect bridge that includes at least one TSV interconnect.

The electronic system 500 may further include one or more input devices 530 for inputting information into the electronic system 500 by a user, such as, for example, a mouse or other pointing device, a keyboard, a touchpad, a button, or a control panel. The electronic system 500 may further include one or more output devices 540 for outputting information (e.g., visual or audio output) to a user such as, for example, a monitor, a display, a printer, an audio output jack, and/or a speaker. In some embodiments, the input device 530 and the output device 540 may comprise a single touchscreen device that can be used both to input information to the electronic system 500 and to output visual information to a user. The input device 530 and the output device 540 may communicate electrically with one or more of the memory device 520 and the electronic signal processor device 510.

Thus, disclosed is a microelectronic device, comprising a base structure comprising: active regions individually comprising semiconductor material; and isolation regions horizontally alternating with the active regions and individually comprising insulative material; epitaxial semiconductor material on the semiconductor material of one of the active regions, the epitaxial semiconductor material substantially confined within a horizontal area of the one of the active regions and offset from horizontal boundaries of two of the isolation regions horizontally neighboring the one of the active regions; gate dielectric material on the epitaxial semiconductor material, portions of the semiconductor material of the one of the active regions not covered by the epitaxial semiconductor material, and portions of the two of the isolation regions; and a gate electrode stack on the gate dielectric material.

Thus, also disclosed is a process of forming a microelectronic device, comprising forming epitaxial semiconductor material on semiconductor material of an active region of a base semiconductor structure, the epitaxial semiconductor material having a smaller horizontal area than a horizontal area of an upper surface of the semiconductor material of the active region; forming gate dielectric material on the epitaxial semiconductor material, on portions of the semiconductor material of the active region not covered by the epitaxial semiconductor material, and on isolation structures within the base semiconductor structure and horizontally neighboring the epitaxial semiconductor material; and forming a stack of gate electrode materials on the gate dielectric material.

Thus, also disclosed is a memory device comprising a memory array region including an array of memory cells; and a logic region including complementary metal oxide semiconductor (CMOS) devices operatively associated with the array of memory cells, at least one of the CMOS devices comprising: an n-type metal oxide semiconductor (NMOS) transistor; and a p-type metal oxide semiconductor (PMOS) transistor operatively associated with the NMOS transistor and comprising: semiconductor material horizontally extending from and between two isolation structures; epitaxial semiconductor material on an upper surface of the semiconductor material and having a different material composition than the semiconductor material, the epitaxial semiconductor material substantially horizontally centered about and having a smaller horizontal area than the upper surface of the semiconductor material; gate dielectric material extending continuously on and across the epitaxial semiconductor material, portions of the semiconductor material not covered by epitaxial semiconductor material, and portions of the two isolation structures; and a gate electrode stack extending continuously on and across the gate dielectric material.

Thus, also disclosed is an electronic system, comprising: an input device; an output device; a processor device operably coupled to the input device and the output device; and a memory device structure operably coupled to the processor device and comprising at least one microelectronic device structure comprising: an array of memory cells; and complementary metal oxide semiconductor (CMOS) devices operably coupled to the array of memory cells, at least one of the CMOS devices comprising: a p-type metal oxide semiconductor (PMOS) transistor comprising: a silicon (Si) channel material horizontally extending from and between two isolation structures; a silicon germanium (SiGe) channel material on an upper surface of the Si channel material, the SiGe channel material completely horizontally offset from each of the two isolation structures and having a smaller horizontal area than the upper surface of the Si channel material gate dielectric material extending continuously over and across the SiGe channel material and portions of the Si channel material not horizontally covered by SiGe channel material; and a stack of different gate electrode materials extending continuously over and across the gate dielectric material; and an n-type metal oxide semiconductor (NMOS) transistor horizontally offset from and operatively coupled to the PMOS transistor, the NMOS transistor substantially free of the SiGe channel material.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
    a base structure comprising:
        active regions individually comprising semiconductor material; and
        isolation regions horizontally alternating with the active regions and individually comprising insulative material;
    epitaxial semiconductor material on the semiconductor material of one of the active regions, the epitaxial semiconductor material substantially confined within a horizontal area of the one of the active regions and offset from horizontal boundaries of two of the isolation regions horizontally neighboring the one of the active regions;
    gate dielectric material directly on the epitaxial semiconductor material, portions of the semiconductor material of the one of the active regions not covered by the epitaxial semiconductor material, and portions of the two of the isolation regions; and
    a gate electrode stack on the gate dielectric material.

2. The microelectronic device of claim 1, wherein the epitaxial semiconductor material comprises epitaxial silicon germanium (SiGe) material.

3. The microelectronic device of claim 2, wherein the epitaxial semiconductor material is substantially horizontally centered between the two of the isolation regions.

4. The microelectronic device of claim 3, wherein a distance between the SiGe material and each of the two of the isolation regions is within a range of from about 10 nm to about 20 nm.

5. The microelectronic device of claim 2, wherein the gate dielectric material comprises:
    dielectric oxide material on the SiGe material, the portions of the semiconductor material of the one of the active regions, and the portions of the two of the isolation regions; and
    high-k dielectric material on the dielectric oxide material.

6. The microelectronic device of claim 2, wherein the gate electrode stack comprises:
    a first gate electrode material on the gate dielectric material and horizontally overlapping the SiGe material, the portions of the semiconductor material of the one of the active regions, and the portions of the two of the isolation regions;
    a second gate electrode material on the first gate electrode material, the second gate electrode material having a different material composition than the first gate electrode material; and
    a third gate electrode material on the second gate electrode material, third gate electrode material having a different material composition than each of the first gate electrode material and the second gate electrode material.

7. The microelectronic device of claim 6, wherein an additional one of the active regions of the base structure horizontally neighbors one of the active regions of the base structure and is substantially free of the first gate electrode material within a horizontal area thereof.

8. The microelectronic device of claim 7, wherein the additional one of the active regions of the base structure is substantially free of the SiGe material within the horizontal area thereof.

9. The microelectronic device of claim 8, further comprising an additional gate electrode stack vertically overlying and horizontally overlapping the additional one of the active regions of the base structure, the additional gate electrode stack comprising:
    the second gate electrode material; and
    the third gate electrode material on the second gate electrode material.

10. The microelectronic device of claim 9, wherein a portion of gate dielectric material horizontally overlap the additional one of the active regions of the base structure and is vertically interposed between the additional gate electrode stack and the additional one of the active regions of the base structure.

11. The microelectronic device of claim 1, further comprising:
    a peripheral interconnect structure on the gate electrode stack and comprising:
        a first conductive material; and
        a second conductive material on the first conductive material;
    a dielectric cap material on the peripheral interconnect structure and the gate electrode stack; and
    a conductive contact structure vertically extending through the dielectric cap material and contacting the peripheral interconnect structure.

12. The microelectronic device of claim 11, wherein the first conductive material of the peripheral interconnect structure comprises polycrystalline silicon.

13. The microelectronic device of claim 1, wherein:
    the epitaxial semiconductor material comprises epitaxial silicon germanium (SiGe) material;
    the gate dielectric material comprises:
        silicon dioxide on the SiGe material, the portions of the semiconductor material of the one of the active regions, and the portions of the two of the isolation regions; and
        hafnium oxide of the silicon dioxide; and
    the gate electrode stack comprises:
        titanium aluminum nitride on the hafnium oxide of the gate dielectric material;
        elemental lanthanum on the titanium aluminum nitride; and
        titanium nitride on the elemental lanthanum.

14. A memory device, comprising:
    a memory array region including an array of memory cells; and
    a logic region including complementary metal oxide semiconductor (CMOS) devices operatively associated with the array of memory cells, at least one of the CMOS devices comprising:
an n-type metal oxide semiconductor (NMOS) transistor; and
a p-type metal oxide semiconductor (PMOS) transistor operatively associated with the NMOS transistor and comprising:
semiconductor material horizontally extending from and between two isolation structures;
epitaxial semiconductor material on an upper surface of the semiconductor material and having a different material composition than the semiconductor material, the epitaxial semiconductor material substantially horizontally centered about and having a smaller horizontal area than the upper surface of the semiconductor material;
gate dielectric material extending continuously directly on and across the epitaxial semiconductor material, portions of the semiconductor material not covered by epitaxial semiconductor material, and portions of the two isolation structures; and
a gate electrode stack extending continuously on and across the gate dielectric material.

15. The memory device of claim 14, wherein horizontal boundaries of the epitaxial semiconductor material individually horizontally offset from horizontal boundaries of one of the two isolation structures most proximate thereto by a distance within a range of from about 10 nanometers (nm) to about 20 nm.

16. The memory device of claim 14, wherein:
the gate dielectric material extends continuously between and is shared by the PMOS transistor and the NMOS transistor; and
some gate electrode materials of the gate electrode stack extends continuously between and are shared by the PMOS transistor and the NMOS transistor.

17. The memory device of claim 16, wherein the NMOS transistor comprises:
additional semiconductor material horizontally extending from and between two additional isolation structures; and
a portion of the gate dielectric material extending continuously on and across the additional semiconductor material and portions of the two additional isolation structures; an additional gate electrode stack extending continuously on and across the portion of the gate dielectric material, the additional gate electrode stack comprising the some gate electrode materials.

18. The memory device of claim 14, wherein:
the semiconductor material comprises polycrystalline silicon; and
the epitaxial semiconductor material comprises epitaxial silicon germanium (SiGe).

19. The memory device of claim 18, wherein:
the gate electrode stack of the PMOS transistor comprises:
titanium aluminum nitride on the gate dielectric material;
elemental lanthanum on the titanium aluminum nitride; and
titanium nitride on the elemental lanthanum; and
the NMOS transistor comprises:
additional gate dielectric material on additional semiconductor material; and
an additional gate electrode stack on the additional gate dielectric material and comprising:
additional elemental lanthanum on the additional gate dielectric material; and
additional titanium nitride on the additional elemental lanthanum.

20. An electronic system, comprising:
an input device;
an output device;
a processor device operably coupled to the input device and the output device; and
a memory device structure operably coupled to the processor device and comprising at least one microelectronic device structure comprising:
an array of memory cells; and
complementary metal oxide semiconductor (CMOS) devices operably coupled to the array of memory cells, at least one of the CMOS devices comprising:
a p-type metal oxide semiconductor (PMOS) transistor comprising:
a silicon (Si) channel material horizontally extending from and between two isolation structures;
a silicon germanium (SiGe) channel material on an upper surface of the Si channel material, the SiGe channel material completely horizontally offset from each of the two isolation structures and having a smaller horizontal area than the upper surface of the Si channel material;
gate dielectric material extending continuously over and across the SiGe channel material and portions of the Si channel material not horizontally covered by SiGe channel material, the gate dielectric material touching the SiGe channel material and portions of the Si channel material not horizontally covered by the SiGe channel material; and
a stack of different gate electrode materials extending continuously over and across the gate dielectric material; and
an n-type metal oxide semiconductor (NMOS) transistor horizontally offset from and operatively coupled to the PMOS transistor, the NMOS transistor substantially free of the SiGe channel material.

21. The electronic system of claim 20, wherein the memory device structure comprises a dynamic random-access memory (DRAM) device.

* * * * *